(12) United States Patent
Chu et al.

(10) Patent No.: US 7,786,468 B2
(45) Date of Patent: Aug. 31, 2010

(54) LAYER TRANSFER OF LOW DEFECT SIGE USING AN ETCH-BACK PROCESS

(75) Inventors: Jack O. Chu, Manhasset Hills, NY (US); David R. DiMilia, Wappingers Falls, NY (US); Lijuan Huang, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/181,613

(22) Filed: Jul. 29, 2008

(65) Prior Publication Data

US 2009/0267052 A1 Oct. 29, 2009

Related U.S. Application Data

(62) Division of application No. 10/948,421, filed on Sep. 23, 2004, now Pat. No. 7,427,773, which is a division of application No. 09/692,606, filed on Oct. 19, 2000, now Pat. No. 6,890,835.

(51) Int. Cl.
*H01L 29/737* (2006.01)

(52) U.S. Cl. .............. 257/19; 257/65; 257/E31.036

(58) Field of Classification Search ............ 257/19, 257/63, 65, E33.008, E31.036
See application file for complete search history.

(56) References Cited

U.S. PATENT DOCUMENTS

| 4,826,787 A | 5/1989 | Muto et al. |
| 5,013,681 A | 5/1991 | Godbey et al. |
| 5,240,876 A | 8/1993 | Gaul et al. |
| 5,298,452 A | 3/1994 | Meyerson |
| 5,387,555 A | 2/1995 | Linn et al. |
| 5,462,883 A | 10/1995 | Dennard et al. |

(Continued)

FOREIGN PATENT DOCUMENTS

EP 0238066 5/1994

(Continued)

OTHER PUBLICATIONS

XP-00211102, "Epitaxial Si-Ge Etch Stop Layers With Ethylene Diamine Procatechol for Bonded And Etchback Silicon-On-Insulator", D. Feijoo et al., AT&T Bell Laboratories, Murray Hill, NJ 07974, revised Feb. 2, 1994.

(Continued)

*Primary Examiner*—Thanhha Pham
(74) *Attorney, Agent, or Firm*—Scully, Scott, Murphy & Presser, P.C.; Louis J. Percello, Esq.

(57) ABSTRACT

A method for forming strained Si or SiGe on relaxed SiGe on insulator (SGOI) or a SiGe on Si heterostructure is described incorporating growing epitaxial $Si_{1-y}Ge_y$ layers on a semiconductor substrate, smoothing surfaces by Chemo-Mechanical Polishing, bonding two substrates together via thermal treatments and transferring the SiGe layer from one substrate to the other via highly selective etching using SiGe itself as the etch-stop. The transferred SiGe layer may have its upper surface smoothed by CMP for epitaxial deposition of relaxed $Si_{1-y}Ge_y$, and strained $Si_{1-y}Ge_y$ depending upon composition, strained Si, strained SiC, strained Ge, strained GeC, and strained $Si_{1-y}Ge_yC$ or a heavily doped layer to make electrical contacts for the SiGe/Si heterojunction diodes.

8 Claims, 4 Drawing Sheets

U.S. PATENT DOCUMENTS

| | | |
|---|---|---|
| 5,476,813 A | 12/1995 | Naruse |
| 5,569,620 A | 10/1996 | Linn et al. |
| 5,650,353 A | 7/1997 | Yoshizawa et al. |
| 5,659,187 A | 8/1997 | Legoues et al. |
| 5,906,951 A | 5/1999 | Chu et al. |
| 6,059,895 A | 5/2000 | Chu et al. |
| 6,103,597 A | 8/2000 | Aspar et al. |
| 6,118,181 A | 9/2000 | Merchant et al. |
| 6,153,495 A | 11/2000 | Kub et al. |
| 6,255,731 B1 | 7/2001 | Ohmi et al. |
| 6,323,108 B1 | 11/2001 | Kub et al. |
| 6,328,796 B1 | 12/2001 | Kub et al. |
| 6,521,041 B2 | 2/2003 | Wu et al. |
| 6,524,935 B1 | 2/2003 | Canaperi et al. |
| 6,573,126 B2 | 6/2003 | Cheng et al. |
| 6,689,211 B1 | 2/2004 | Wu et al. |
| 2002/0072130 A1 | 6/2002 | Cheng et al. |

FOREIGN PATENT DOCUMENTS

| | | |
|---|---|---|
| JP | 5-15453 | 2/1993 |
| JP | 7-58304 | 3/1995 |
| JP | 9-180999 | 7/1997 |
| JP | 10-308503 | 11/1998 |
| JP | 11-233771 | 8/1999 |
| JP | 2000-31491 | 1/2000 |
| JP | 2001-217430 | 8/2001 |
| WO | WO 99/30370 | 6/1999 |
| WO | WO 99/53539 | 10/1999 |

OTHER PUBLICATIONS

T. Mizuno, "High Performance Strained-Si p MOSFET's on SiGe-On-Insulator Substrates fabricated by SIMOX Technology", IEDM Tech. Digest 99-934, 1999.

Wolf et al., "Silicon Processing for the VLSI Era", vol. 1-Process Technology, 2nd ed., Lattice Press: Sunset Beach CA, 2000, pp. 386-391.

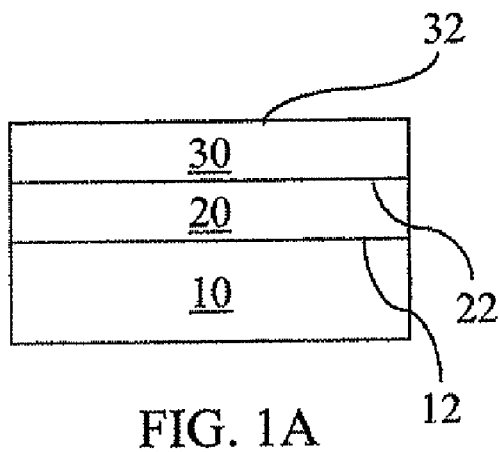
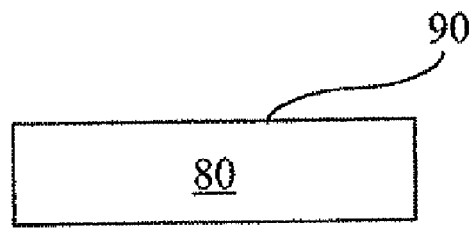
FIG. 1A  FIG. 2A
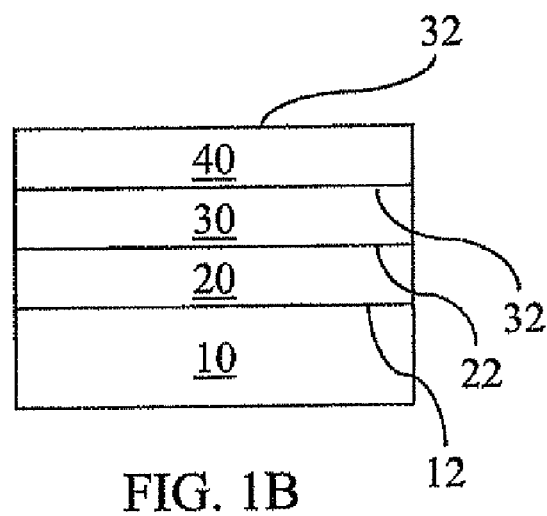
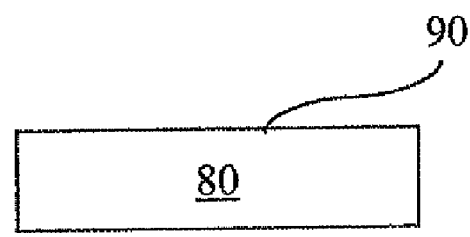
FIG. 1B  FIG. 2B
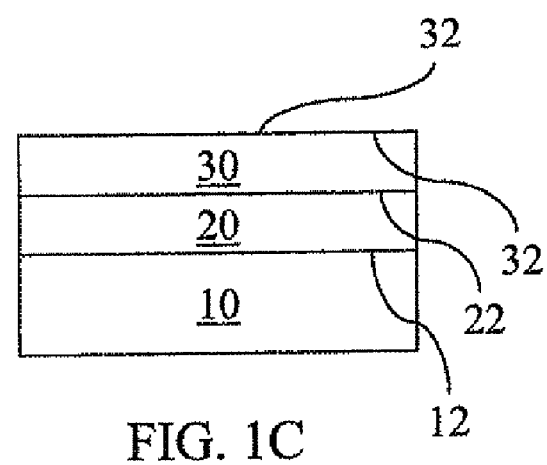
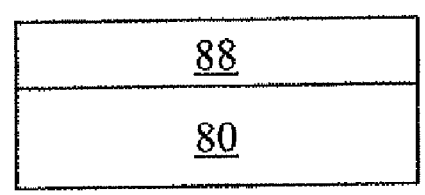
FIG. 1C  FIG. 2C

LAYER TRANSFER OF LOW DEFECT SIGE USING AN ETCH-BACK PROCESS

PRIORITY INFORMATION

This application is a divisional application of U.S. patent application Ser. No. 10/948,421, filed Sep. 23, 2004, which is a divisional of U.S. patent application Ser. No. 09/692,606 filed on Oct. 19, 2000, which later issued as U.S. Pat. No. 6,890,835 on May 10, 2005 and as such, claims priority from Ser. Nos. 09/692,606 and 10/948,421 and U.S. Pat. No. 6,890,835.

FIELD OF INVENTION

This invention relates to transferring a SiGe layer onto a second substrate and forming a new material structure that has emerging applications in microelectronics and optoelectronics. In particular, a strained Si/SiGe layer on an insulator structure is useful for fabricating high speed devices such as complementary metal oxide semiconductor (CMOS) transistors, modulation doped field effect transistors (MODFETs), high electron mobility transistors (HEMTs), and bipolar transistors (BTs); SiGe layer on Si heterostructures can be used to produce photodetectors to provide Si-based far infrared detection for communication, surveillance and medical applications.

BACKGROUND OF THE INVENTION

For applications in microelectronics, high carrier mobilities are desirable. It has been found that electron mobility in strained Si/SiGe channels is significantly higher than that in bulk Si. For example, measured values of electron mobility in strained Si at room temperature are about 3000 cm$^2$/Vs as opposed to 400 cm$^2$V/s in bulk Si. Similarly, hole mobility in strained SiGe with high Ge concentration (60%~80%) reaches up to 800 cm$^2$V/s the value of which is about 5 times the hole mobility of 150 cm$^2$V/s in bulk Si. The use of these materials in state-of-the-art Si devices is expected to result in much higher performances, higher operating speeds in particular. However, the underlying conducting substrate for MODFETs and HBTs or the interaction of the underlying substrate with active device region in CMOS are undesirable features which limit the full implementation of high speed devices. To resolve the problem, an insulating layer is proposed to isolate the SiGe device layer from the substrate. Therefore, there is a need for techniques capable of fabricating strained Si/SiGe on insulator materials.

There are two available techniques for making SiGe-On-Insulator (SGOI). One is via SIMOX as reported in a publication by T. Mizuno et al., entitled "High Performance Strained-Si p-MOSFETs on SiGe-on-Insulator Substrates Fabricated by SIMOX Technology," IEDM, 99-934. However, this method has several limits because the oxygen implantation induces further damages in the relaxed SiGe layer in addition to the existing defects caused by lattice mismatch. And, the high temperature anneal (>1100° C.) needed to form oxide after the oxygen implantation is detrimental to the strained Si/SiGe layers since Ge tends to diffuse and agglomerate at temperatures above 600° C., this effect becomes more significant when Ge content is higher than 10%.

The second technique of making SiGe on insulator is via selective etching with the aid of an etch stop. In U.S. Pat. No. 5,906,951 by J. O. Chu and K. E. Ismail which issued in May 1999, a method of utilizing wafer bonding and backside wafer etching in KOH with a p$^{++}$-doped SiGe etch-stop to transfer a layer of strained Si/SiGe on a SOI substrate was described. However, the etching selectivity of SiGe to p$^{++}$-doped SiGe etch-stop in KOH decreases sharply as the doping level in the etch stop layer is below $10^{19}$/cm$^3$, therefore, the strained Si/SiGe layer may also be subjected to KOH etching if etching could not stop uniformly at the p$^{++}$ SiGe etch-stop layer due to variation of dopants in the p$^{++}$ etch-stop layer. Furthermore, since the SiGe etch-stop layer is heavily doped with boron in the range from about $5\times10^{19}$ to about $5\times10^{20}$/cm$^3$, there are chances of auto-doping of the strained Si/SiGe during thermal treatment.

For fiber optic applications, SiGe/Si heterojunction diodes are a good choice for demodulating 1.3-1.6 um light at 300K. The use of 30% to 50% Ge is suggested to achieve absorption at the desired 1.3-1.6 um wavelength and low defects such as dislocations in the SiGe layer is needed to enhance the photodetector sensitivity. The state-of-the-art technology to achieve SiGe/Si heterojunction diodes with high responsivity, low noise, and fast response is to form a 100-period SiGe/Si strained layer superlattice. However, the alloy then no longer behaves like the bulk material due to the quantum size effect. The net result of the quantum size effect is that the absorption occurs at wavelengths (1.1-1.3 um) shorter than expected. Therefore, a bulk SiGe alloy with desirable Ge content and low defects is needed to fabricate photodetectors that would absorb lights in the range of 1.3-1.6 um.

The invention provides a method capable of transferring a low defect SiGe layer onto a desirable substrate using the etch-back method but without any additional heavily doped etch-stop layer. The key feature of this invention is that a SiGe layer serves both as the layer over which the epitaxial strained Si/SiGe is grown but also as an etch-stop layer itself in some specific etching solutions. In other words, the SiGe layer is a self-etch-stop in this case. As a result, the process of fabricating strained Si/SiGe on insulator or a SiGe/Si heterostructure is greatly simplified and the quality of the strained Si/SiGe or SiGe/Si heterostructure is significantly improved.

SUMMARY OF THE INVENTION

In accordance with the present invention, a method for transferring low defect SiGe bulk layer onto a second substrate and forming strained Si/SiGe on an insulator (SGOI) or SiGe/Si heterostructure is described. This approach comprises the steps of selecting a semiconductor substrate, forming a first epitaxial graded layer of $Si_{1-x}Ge_x$ over the semiconductor substrate, forming a second relaxed $Si_{1-y}Ge_y$ over the first graded $Si_{1-x}Ge_x$ layer, selecting a second substrate, bonding the first substrate to said second substrate to form a joined substrate, grinding and polishing the first substrate from its backside to remove the majority of said first substrate, etching the remaining material of the first substrate and stopping at the $Si_{1-x}Ge_x$ utilizing a SiGe highly selective wet etch process, applying chemical-mechanical planarization (CMP) to remove the defective portion of the graded $Si_{1-x}Ge_x$ layer, smoothing the surface of the $Si_{1-x}Ge_x$ layer by a CMP process step, growing strained Si/SiGe layers over the smoothed surface of the $Si_{1-x}Ge_x$ layer for MOSFET, MODFET, HEMT or BT for microelectronic applications, or growing SiGe photodectors for applications in optoelectronics.

The invention provides a method capable of transferring a low defect SiGe layer onto a desirable substrate using the etch-back method but without any additional heavily doped etch-stop layer. The key feature of this invention is that a SiGe layer serves both as the layer over which the epitaxial strained Si/SiGe is grown but also as an etch-stop layer itself in some specific etching solutions. In other words, the SiGe layer is a self-etch-stop in this case. As a result, the process of fabricating strained Si/SiGe on insulator or a SiGe/Si heterostructure is greatly simplified and the quality of the strained Si/SiGe or SiGe/Si heterostructure is significantly improved.

BRIEF DESCRIPTION OF THE DRAWINGS

The invention is described in more details thereinafter relative to non-limitative embodiments and with reference to the attached drawings, wherein show:

FIG. 1A is a cross section view of the first substrate with epitaxially grown graded $Si_{1-x}Ge_x$ and relaxed $Si_{1-y}Ge_y$ layers according to a first embodiment of the present invention.

FIG. 1B is a cross section view of the first substrate with epitaxially grown graded $Si_{1-x}Ge_x$, relaxed $Si_{1-y}Ge_y$, and an encapsulation layer according to a second embodiment of the present invention.

FIG. 1C is a cross section view of the first substrate with epitaxially grown graded $Si_{1-x}Ge_x$ and relaxed $Si_{1-y}Ge_y$ layers according to a third embodiment of the present invention.

FIG. 2A is a cross section view of a second substrate according to the first embodiment of the present invention.

FIG. 2B is a cross section view of a second substrate according to the second embodiment of the present invention.

FIG. 2C is a cross section view of a second substrate with an intermediate layer according to the third embodiment of the present invention.

DETAILED DESCRIPTION OF THE PREFERRED EMBODIMENTS

Figure 3A:
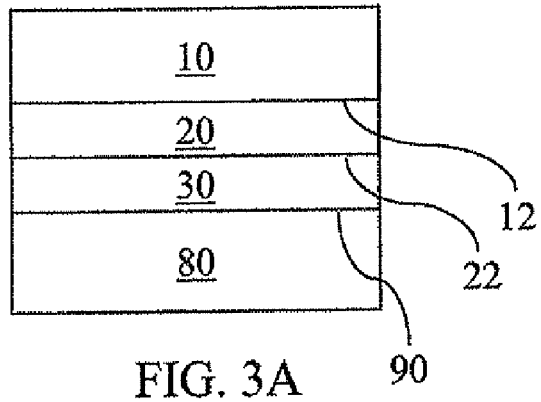
FIG. 3A is a cross section view of the first semiconductor substrate bonded to the second substrate according to the first embodiment of the present invention.

The embodiments which will now be described in conjunction with the above drawings relate to the formation of a layer of monocrystalline strained Si/SiGe on an insulator material (SGOI) or a SiGe layer on Si with the aid of planarization of surfaces, wafer bonding and a selective wet etching process using SiGe as the etch-stop layer. Figures with a labeling suffix of A refer to the first embodiment of the present invention; those with a labeling suffix B refer to the second embodiment of the present invention; those with a labeling suffix C refer to the second embodiment of the present invention. All three embodiments are described in parallel in the description of the present invention.

Referring now to FIG. 1A-1C, a cross section view of a partial embodiment of the invention is shown comprising a substrate 10 and a plurality of layers 20, 30 and 40. Substrate 10 may be a single crystal material such as Si, SiGe, SiGeC, SiC etc. suitable for forming epitaxial layers thereon. An epitaxial graded layer 20 of $Si_{1-x}Ge_x$ is formed on the upper surface 12 of substrate 10. The upper surface 22 of graded layer 20 is substantially relaxed or completely relaxed. The relaxation may be due to a modified Frank-Read mechanism described by LeGoues et al., in U.S. Pat. No. 5,659,187 which issued on Aug. 19, 1997 and is incorporated herein by reference. A method for forming a graded SiGe layer 20 is described in U.S. Pat. No. 5,659,187 by LeGoues et al. Layer 20 as well as layer 30 (to be described below) may be formed in a UHV CVD process as described in U.S. Pat. No. 5,298,452 by B. S. Meyerson which issued Mar. 29, 1994 and is incorporated herein by reference. In layer 20, the concentration x of Ge may range from zero to a value in the range from 0.2 to 0.5. Layer 20 may have a thickness in the range from about 3,000 angstroms to 1000 nm.

Epitaxial layer 30 is comprised substantially or completely of relaxed $Si_{1-y}Ge_y$ and is formed on upper surface 22 of layer 20. Layer 30 may have a thickness in the range from 200 nm to 1000 nm. The Ge content y in layer 30 is chosen to match the crystal lattice constant of upper surface 22 of layer 20 such that layer 30 is relaxed or essentially strain free. The Ge content y in layer 30 may be equal to or about the value of x at upper surface 22. The value y may be in the range from about 0.2 to about 0.5. An encapsulation layer 40 may be formed over relaxed layer 30. According to the first and third embodiments, an encapsulation layer 40 is not formed. According to the second embodiment, an encapsulation layer 40 is formed. Encapsulation layer 40 may be formed on upper surface 32 of layer 30 via PECVD, LPCVD, UHV CVD or spin-on techniques. Encapsulation layer 40 may have an upper surface 42. The encapsulation material may be, for example, Si, $SiO_2$, Poly Si, $Si_3N_4$, low-k dielectric materials, for example, Diamond Like Carbon (TLC), Fluorinated Diamond Like Carbon (FDLC), a polymer of Si, C, O, and H or a combination of any two or more of the foregoing materials. One example of a polymer of Si, C, O, and H is SiCOH which is described in Ser. No. 09/107,567 filed Jun. 29, 1998 by Grill et al., entitled "Hydrogenated Oxidized Silicon Carbon Material" which is incorporated herein by reference. The deposition temperature for forming layer 40 may be below 900° C. The thickness of the encapsulation layer is in the range from about 5 nm to about 500 nm. Encapsulation layer 40 functions to protect upper surface 32 of layer 30 or to provide an isolation layer.

In FIGS. 2A and 2B, a second substrate 80 is shown according to the first embodiment of the present invention. In FIG. 2C, a second substrate 80 and an intermediate layer 88 are shown according to the third embodiment of the present invention. The method of forming an intermediate layer formed over a second substrate as disclosed in claim 1 of U.S. Pat. No. 6,890,835, from which the instant application claims priority, is herein incorporated.

Figure 3B:
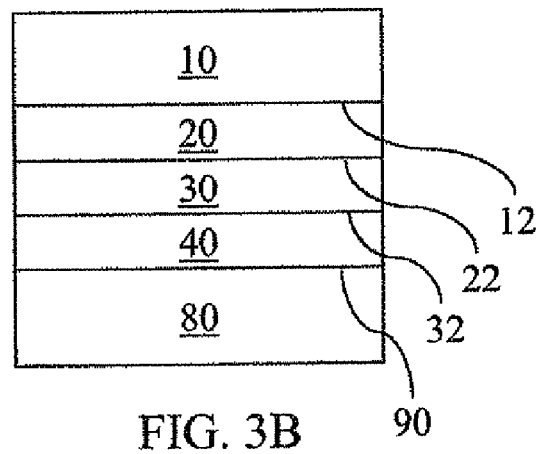
FIG. 3B is a cross section view of the first semiconductor substrate bonded to the second substrate according to the second embodiment of the present invention.

According to the first and second embodiments of the present invention, in FIGS. 3A-3B, a second substrate 80 is bonded to upper surface 32 of layer 30 or to upper surface 42 of layer 40. Specifically, according to the first embodiment, a second substrate 80 is bonded to upper surface 32 of layer 30. According to the second embodiment, a second substrate 80 is bonded to upper surface 42 of layer 40. Prior to wafer bonding, surface 32 of layer 30 or surface 42 of layer 40 is polished by a Chemo-Mechanical Planarization or Polishing (CMP) process to smooth surface 42 to a planar surface having a surface roughness in root mean square (RMS) in the range from about 0.3 nm to about 1 nm. Substrate 80 which may be a semiconductor such as Si, SiGe, SiGeC, SiC, sapphire, glass, ceramic, or metal and has an upper surface 90 which may be polished as above to provide a smooth upper surface 90 having a RMS in the range from about 0.3 nm to about 1 nm.

For a further description on bonding wafers to provide a bonded structure, reference is made to Ser. No. 09/675840 filed Sep. 29, 2000 by D. F. Canaperi et al., entitled "Preparation of Strained Si/SiGe on Insulator by Hydrogen Induced Layer Transfer Technique" which is incorporated herein by reference. The method of making SGOI by wafer bonding and H-implantation induced layer transfer is described in Ser. No. 09/675840. This method can produce SiGe with higher Ge content onto an insulator compared to the prior art. Further, this method can reduce the amount of defects in the SiGe layer due to the elimination of the misfit dislocations compared to the prior art. However, with this method, the transferred SiGe layer is relatively thin (<1 um) and transferring a high Ge content layer is still difficult to achieve due to implantation of H and annealing at 500 to 600° C. to induce layer transfer.

Figure 3C:
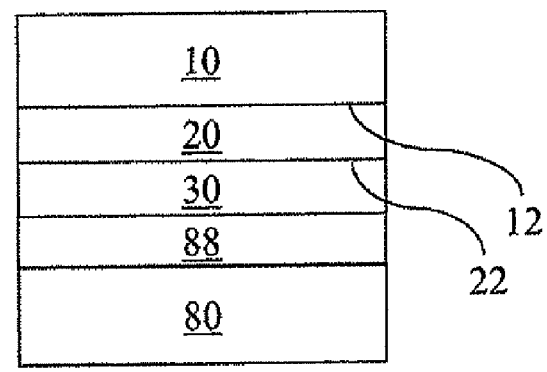
FIG. 3C is a cross section view of the first semiconductor substrate bonded to the second substrate according to the third embodiment of the present invention.

According to the second embodiment of the present invention, the top surface of layer 40 shown in FIG. 1B is turned upside down and brought into contact with surface 90 of substrate 80. The two surfaces 42 and 90 are brought together by the wafer bonding approach. The bonded surfaces or 42 and 90 are annealed at a temperature in the range from about 20° C. to about 500° C. for a time period in the range from about 2 hours to about 50 hours. FIG. 3C shows the third embodiment. The third embodiment of the present invention uses intermediate layers such as Ge, or metal materials which either have a low-melting point or react with silicon to form a silicide such materials may be tungsten (W), cobalt (Co), titanium (Ti) etc. to achieve high bonding strength at anneal temperatures in the range from 100° C. to 800° C. The anneal can be either a furnace anneal or a rapid thermal anneal (RTA).

Figure 4A:
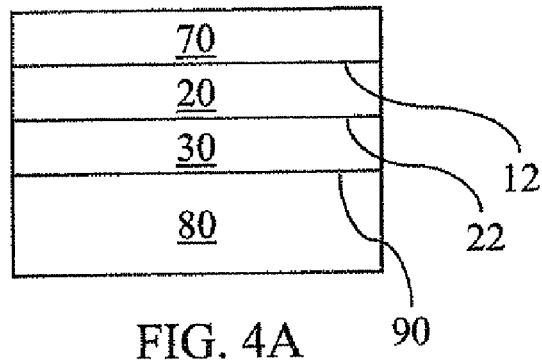
FIG. 4A is a cross section view of the first substrate shown in FIG. 3A thinned by grinding and polishing from its back side according to the first embodiment of the present invention.
Figure 4B:
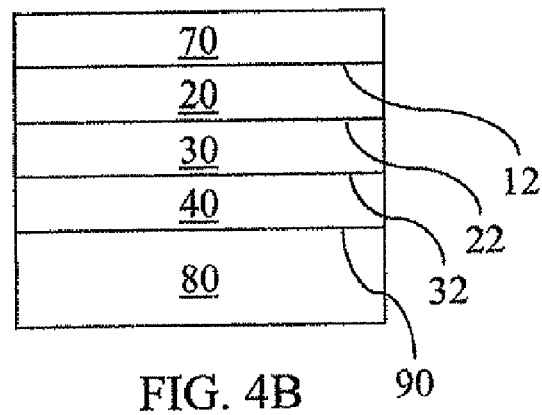
FIG. 4B is a cross section view of the first substrate shown in FIG. 3B thinned by grinding and polishing from its back side according to the second embodiment of the present invention.
Figure 4C:
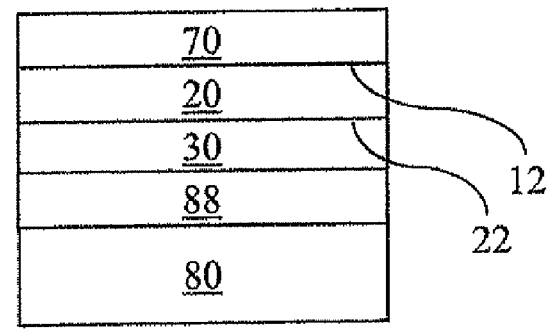
FIG. 4C is a cross section view of the first substrate shown in FIG. 3C thinned by grinding and polishing from its back side according to the third embodiment of the present invention.

FIGS. 4A-4C show the removal of the majority of the first substrate 10 which is in the range from about 600 um to about 750 um in thickness with a grinding or a combination of grinding and polishing process. The remaining layer 70 of the first substrate 10 has a thickness in the range from about 50 um to about 100 um.

Figure 5A:
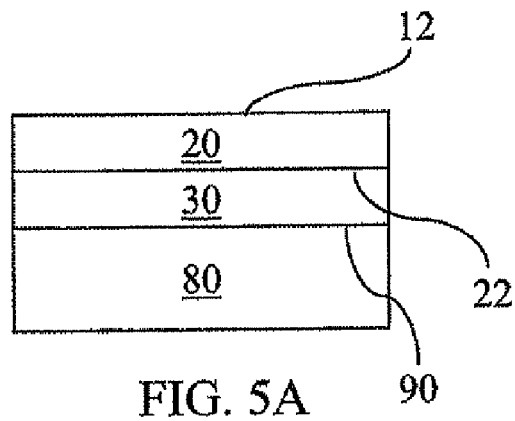
FIG. 5A is a cross section view of the remainder of the first substrate shown in FIG. 4A after the step of etching and stopping at the graded $Si_{1-x}Ge_x$ layer by a highly selective wet etching process according to the first embodiment of the present invention.
Figure 5B:
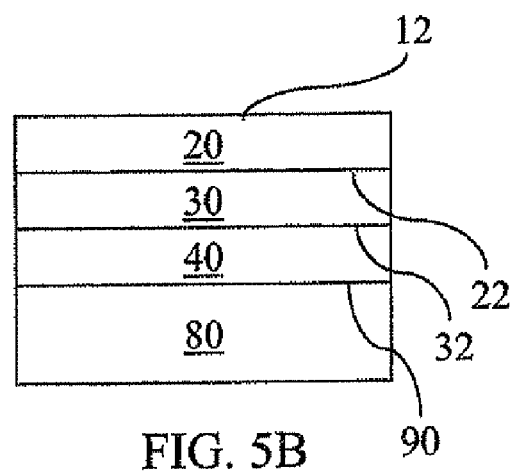
FIG. 5B is a cross section view of the remainder of the first substrate shown in FIG. 4B after the step of etching and stopping at the graded $Si_{1-x}Ge_x$ layer by a highly selective wet etching process according to the second embodiment of the present invention.
Figure 5C:
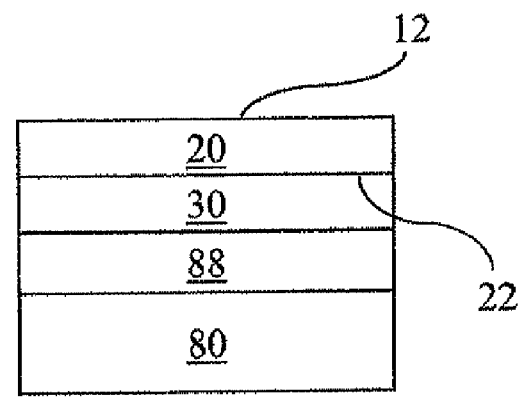
FIG. 5C is a cross section view of the remainder of the first substrate shown in FIG. 4C after the step of etching and stopping at the graded $Si_{1-x}Ge_x$ layer by a highly selective wet etching process according to the third embodiment of the present invention.

FIGS. 5A-5C show the removal of layer 70 such as with a wet etching process in a solution of ethylenediamine, pyrocatechol, pyrazine, water (EPPW or EDP) at a temperature in the range from about 90° C. to about 120° C. or in a solution of 20% KOH at a temperature in the range from about 70 to about 85° C. or in another organic Si etch solution of TMAH (tetramethyl ammoniumhydroxide, $(CH_3)_4NOH$). The etching selectivity of Si (100) to $Si_{1-x}Ge_x$ (y=0.15~0.3) in EPPW is experimentally determined to be in the range of 50-1800. The etching selectivity of Si (100) to $Si_{1-x}Ge_x$ (y=0.2~0.3) in KOH is experimentally determined to be in the range of 350-1280, and the etching selectivity of Si (100) to $Si_{1-x}Ge_x$ (y=0.2~0.3) in TMAH is experimentally determined to be in the range of 50-115. In a prior art of U.S. Pat. No. 5,476,813 which issued Dec. 19, 1995 to H. Naruse by a mixed solution of KOH, $K_2Cr_2O_7$, and propanol is used for selective etching of silicon while stopping at SiGe layer. However, a much lower selectivity of about 17 to 20 is achieved. In our invention, EPPW, KOH or TMAH has a much higher etching rate of Si compared to $Si_{1-y}Ge_y$ (y>0.1), as a result, the etching process stops nicely at the relaxed $Si_{1-y}Ge_y$ without any additional etch-stop layer such as the $p^{++}$ SiGe etch-stop as described in U.S. Pat. No. 5,906,951 which issued May 25, 1999 to J. O. Chu et al.

Figure 6A:
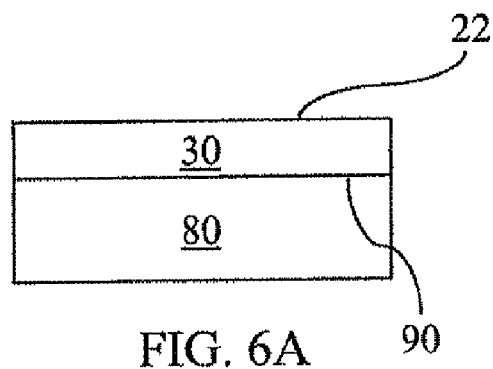
FIG. 6A is a cross section view of the remaining $Si_{1-x}Ge_x$ layer from FIG. 5A polished away and the $Si_{1-y}Ge_y$ layer smoothed with a chemical-mechanical planarization (CMP) process according to the first embodiment of the present invention.
Figure 6B:
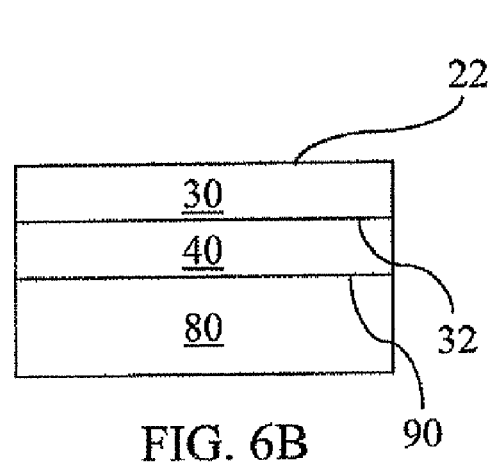
FIG. 6B is a cross section view of the remaining $Si_{1-x}Ge_x$ layer from FIG. 5B polished away and the $Si_{1-y}Ge_y$ layer smoothed with a chemical-mechanical planarization (CMP) process according to the second embodiment of the present invention.
Figure 6C:
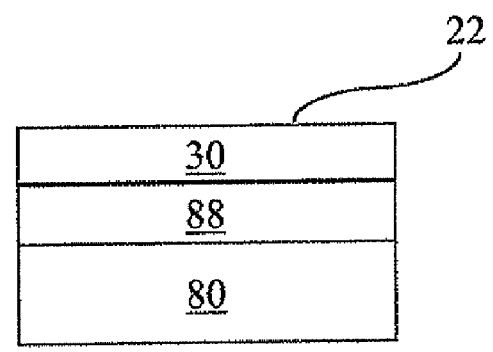
FIG. 6C is a cross section view of the remaining $Si_{1-x}Ge_x$ layer from FIG. 5C polished away and the $Si_{1-y}Ge_y$ layer smoothed with a chemical-mechanical planarization (CMP) process according to the third embodiment of the present invention.

FIGS. 6A-6C show the cross-section view of a SiGe layer on insulator or a SiGe/Si heterostructure after applying a CMP process step to remove the step-graded $Si_{1-x}Ge_x$ layer 20. The structure has relaxed $Si_{1-y}Ge_y$ layer 30 on top. The chemical-mechanical planarization (CMP) process is used to remove the graded $Si_{1-x}Ge_x$ layer 20 and to adjust the thickness of the transferred relaxed $Si_{1-y}Ge_y$ layer 30. A final touch polishing and cleaning is used to smooth and clean the surface for epitaxial growth of strained Si/SiGe or for the deposition of a layer of $n^+$ Si as needed for form a p-i-n photodetector.

Figure 7A:
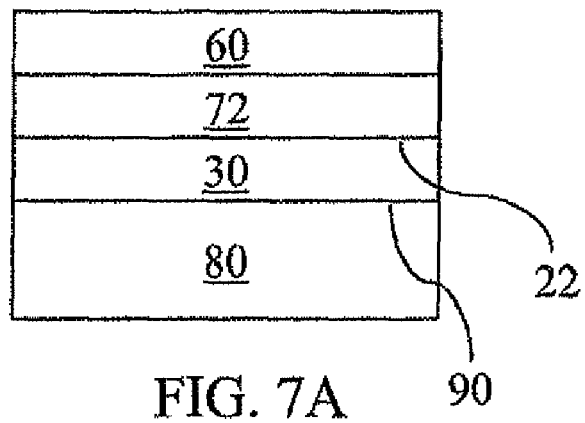
FIG. 7A is a cross section view of an epitaxially grown strained Si/SiGe layer or a p-i-n photodetector epitaxially grown over the smoothed $Si_{1-y}Ge_y$ layer from FIG. 6A according to the first embodiment of the present invention.
Figure 7B:
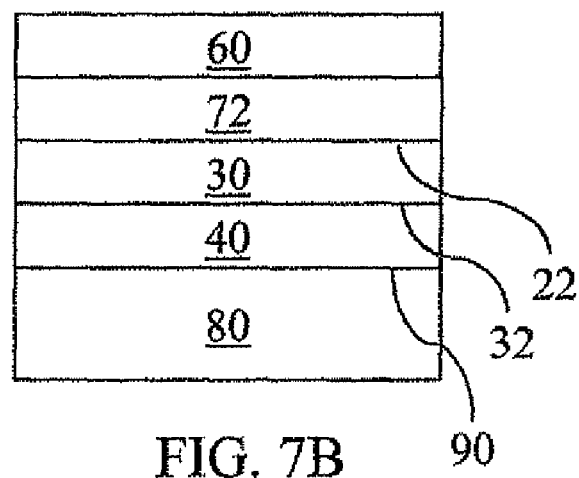
FIG. 7B is a cross section view of an epitaxially grown strained Si/SiGe layer or a p-i-n photodetector epitaxially grown over the smoothed $Si_{1-y}Ge_y$ layer from FIG. 6B according to the second embodiment of the present invention.
Figure 7C:
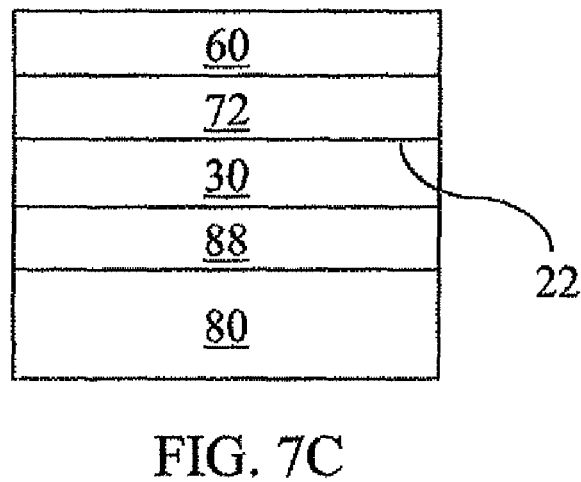
FIG. 7C is a cross section view of an epitaxially gown strained Si/SiGe layer or a p-i-n photodetector epitaxially grown over the smoothed $Si_{1-y}Ge_y$ layer from FIG. 6C according to the third embodiment of the present invention.

In FIGS. 7A-7C, a layer 60 of strained Si/SiGe or of $n^+$ Si is epitaxially grown or formed over SiGe layer 30. For the epitaxial growth of strained Si/SiGe layer, an optional epitaxial SiGe buffer layer 72 over layer 30 may be needed before the growth of the strained Si/SiGe layer 60.

It should be noted in the drawing that like elements or components are referred to by like and corresponding reference numerals.

While there has been described and illustrated a method for forming strained Si or SiGe on SiGe on insulator (SGOI) or strained SiGe/Si heterostructure using wafer bonding and wet etching, it will be apparent to those skilled in the art that modifications and variations are possible without deviating from the broad scope of the invention which shall be limited solely by the scope of the claims appended hereto.

The invention claimed is:

1. A multi layer substrate for use in forming integrated circuits comprising:
   a silicon containing substrate;
   an epitaxial graded $Si_{1-x}Ge_x$ layer disposed on said silicon containing substrate, wherein the value of x ranges from zero to 0.5;
   a relaxed $Si_{1-y}Ge_y$ layer disposed on epitaxial graded $Si_{1-x}Ge_x$ layer;
   an intermediate layer directly contacted and bonded on said relaxed $Si_{1-y}Ge_y$ layer, said intermediate layer composed of germanium (Ge), tungsten (W), cobalt (Co) or titanium (Ti); and
   a second substrate disposed directly on and contacted with said intermediate layer.

2. The multi layer substrate of claim 1, wherein the value of said y is in the range of about 0.2 to about 0.5.

3. The multi layer substrate of claim 1, wherein the thickness of said epitaxial graded $Si_{1-x}Ge_x$ layer is in the range from about 300 nm to 1,000 nm.

4. The multi layer substrate of claim 1, wherein the thickness of said relaxed $Si_{1-y}Ge_y$ layer is in the range from 200 nm to 1,000 nm.

5. The multi layer substrate of claim 1, wherein said second substrate comprises a material selected from the group consisting of Si, SiGe, SiGeC, SiC, sapphire, glass, ceramic, and metal.

6. The multi layer substrate of claim 1, wherein said epitaxial $Si_{1-y}Ge_y$ layer is free of hydrogen implants.

7. A multi layer substrate for use in forming integrated circuits comprising:
   a silicon containing substrate;
   an epitaxial graded $Si_{1-x}Ge_x$ layer disposed on said silicon containing substrate, wherein the value of x ranges from zero to 0.5;
   a relaxed $Si_{1-y}Ge_y$ layer disposed on epitaxial graded layer;
   an intermediate layer directly contacted and bonded on said relaxed $Si_{1-y}Ge_y$ layer, said intermediate layer is a metal material that reacts with silicon to form a silicide wherein said metal material is selected from a group consisting of tungsten (W), cobalt (Co) and titanium (Ti); and
   a second substrate disposed directly on and contacted with said intermediate layer.

8. A multi layer substrate for use in forming integrated circuits comprising:
   a silicon containing substrate;
   an epitaxial graded $Si_{1-x}Ge_x$ layer disposed on said silicon containing substrate, wherein the value of x ranges from zero to 0.5;
   a relaxed $Si_{1-y}Ge_y$ layer disposed on epitaxial graded $Si_{1-x}Ge_x$ layer;
   a pure germanium layer directly bonded on and contacted with said relaxed $Si_{1-y}Ge_y$; and
   a second substrate disposed directly on and contacted with said pure germanium layer.

* * * * *